United States Patent
Nakagawa et al.

(10) Patent No.: US 11,289,552 B2
(45) Date of Patent: Mar. 29, 2022

(54) DISPLAY PANEL

(71) Applicant: SHARP KABUSHIKI KAISHA, Sakai (JP)

(72) Inventors: Hidetoshi Nakagawa, Sakai (JP); Yoshihisa Takahashi, Sakai (JP); Masahiro Matsuda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/185,180

(22) Filed: Feb. 25, 2021

(65) Prior Publication Data

US 2021/0272949 A1 Sep. 2, 2021

Related U.S. Application Data

(60) Provisional application No. 62/982,595, filed on Feb. 27, 2020.

(51) Int. Cl.
  *H01L 27/12* (2006.01)
  *H01L 27/32* (2006.01)
  *H01L 27/02* (2006.01)
  *H01L 21/66* (2006.01)

(52) U.S. Cl.
  CPC .......... *H01L 27/3244* (2013.01); *H01L 22/32* (2013.01); *H01L 27/0248* (2013.01); *H01L 27/0251* (2013.01); *H01L 27/1244* (2013.01); *H01L 27/3276* (2013.01)

(58) Field of Classification Search
  CPC ............. H01L 27/0251; H01L 27/0288; H01L 27/124; H01L 27/1214; H01L 27/3244; H01L 27/3276; H01L 22/32; H01L 27/0248; H01L 27/1244; G02F 1/136204; G02F 1/1368; G02F 2202/22
  See application file for complete search history.

(56) References Cited

U.S. PATENT DOCUMENTS

| | | | |
|---|---|---|---|
| 2009/0206339 A1* | 8/2009 | Park | B82Y 20/00 257/59 |
| 2018/0033806 A1* | 2/2018 | Long | H01L 27/1244 |
| 2018/0129107 A1* | 5/2018 | Hong | G02F 1/136259 |
| 2021/0265391 A1* | 8/2021 | Nakagawa | H01L 27/124 |

FOREIGN PATENT DOCUMENTS

JP H04-097136 A 3/1992

* cited by examiner

*Primary Examiner* — Shouxiang Hu
(74) *Attorney, Agent, or Firm* — ScienBiziP, P.C.

(57) ABSTRACT

A display panel includes a substrate, a gate metal layer formed on a substrate, an insulating layer that covers the gate metal layer, and a source metal layer formed on the insulating layer. In a driving circuit region, the gate metal layer includes a first electrode and a second electrode separated from each other in a first direction and close to each other. The first electrode is positioned nearer than the second electrode to an active region and has a first side on a side facing the second electrode. The second electrode includes an ESD sacrificial portion. The ESD sacrificial portion includes a first part extending in the first direction and a second part facing the first side and extending in a second direction intersecting the first direction, the second part not overlapping a source metal of the source metal layer.

12 Claims, 5 Drawing Sheets

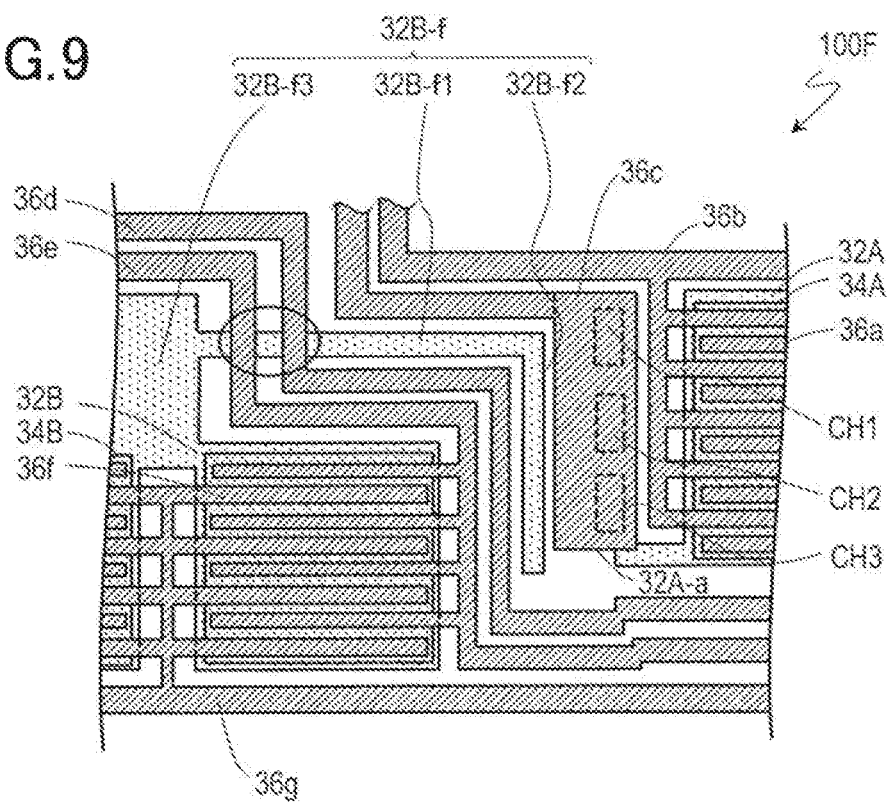

DISPLAY PANEL

TECHNICAL FIELD

The disclosure relates to a display panel and, in particular, relates to an active matrix type display panel including a thin film transistor (Thin Film Transistor: TFT).

BACKGROUND ART

A liquid-crystal display panel and an active matrix type display panel, which is represented by an organic EL display panel, have been widely utilized. As the size and/or the definition of display panels increases, mass production becomes more difficult.

As a factor of decreasing the yield of manufacturing, there is destruction by electrostatic discharge (ElectroStatic Discharge: ESD) in a manufacturing process. A TFT is protected from being destroyed by ESD by, for example, connecting all electrodes to a short ring until the manufacture of the TFT is completed (for example, PTL 1).

CITATION LIST

Patent Literature

[PTL 1] Japanese Unexamined Patent Application Publication No. 4-97136

SUMMARY

Technical Problem

However, according to the study by the present inventor, it has been found that, with an increase in the size and/or the definition of display panels, another defect due to ESD occurs. In this defect, for example, ESD occurs between patterns of a gate metal layer when, in a process of forming a TFT on a substrate, a gate insulating film and a semiconductor film are formed and subjected to patterning after the gate metal layer is formed on the substrate. This is considered to be caused by, for example, an increase in the amount of electric charges accumulated on the gate bus line as a result of an increase in the length of a gate bus line of an active region in a large display panel. The electric charges jump outward from the side of the active region, a gate metal on a side that has received the electric charges is melted down, and the insulating film is destroyed. When a source metal is formed on a melted-down portion in a following process, a short circuit occurs on the melted-down portion.

Thus, an object of the disclosure is to provide a display panel in which occurrence of defects due to ESD is suppressed.

Solution to Problem

According to an embodiment of the disclosure, solutions described in the following items are provided.

<Item 1>

A display panel having an active region and a peripheral region including a driving circuit region disposed outside the active region in a first direction, the display panel including a substrate, a gate metal layer formed on the substrate, an insulating layer that covers the gate metal layer, and a source metal layer formed on the insulating layer, in which, in the driving circuit region, the gate metal layer includes a first electrode and a second electrode separated from each other in the first direction and close to each other, in which the first electrode is positioned nearer than the second electrode to the active region and has a first side on a side facing the second electrode, in which the second electrode includes an ESD sacrificial portion, and in which the ESD sacrificial portion includes a first part extending in the first direction and a second part facing the first side and extending in a second direction intersecting the first direction, the second part not overlapping a source metal of the source metal layer.

<Item 2>

The display panel described in the item 1 in which the first part of the ESD sacrificial portion includes a part that overlaps the source metal of the source metal layer, and the second part forms, with the first part, a bent portion.

<Item 3>

The display panel described in the item 1 in which the first part of the ESD sacrificial portion includes a part that overlaps the source metal of the source metal layer, and the second part forms, with the first part, a T-shaped portion.

<Item 4>

The display panel described in the item 1 in which the ESD sacrificial portion further includes a third part extended in a direction intersecting the first direction, in which the first part is formed between the second part and the third part, in which the first part includes a part that overlaps the source metal of the source metal layer, and in which the second part and the third part do not overlap the source metal of the source metal layer.

<Item 5>

The display panel described in any of the items 1 to 4 in which the first part of the ESD sacrificial portion includes a part that overlaps the source metal of the source metal layer, in a location farther than a center of the first part in the first direction from the first electrode.

<Item 6>

The display panel described in the item 1 in which the ESD sacrificial portion further includes a third part extending in a direction intersecting the first direction, in which the first part is formed between the second part and the third part, in which the third part includes a part that overlaps the source metal of the source metal layer, and in which the first part and the second part do not overlap the source metal of the source metal layer.

<Item 7>

The display panel described in any of the items 1 to 6 in which the second part includes a part projecting toward the first side.

<Item 8>

The display panel described in any of the items 1 to 7 in which the ESD sacrificial portion includes a fourth part extending from the second part, the fourth part facing a second side of the first electrode, the second side intersecting the first side.

<Item 9>

The display panel described in the items 1 to 8 in which the ESD sacrificial portion includes a part that overlaps the source metal of the source metal layer, in a location farther than a side of an electrode body of the second electrode excluding the ESD sacrificial portion, the side being near the first electrode, from the first electrode.

<Item 10>

The display panel described in any of the items 1 to 9 in which the ESD sacrificial portion includes a part that overlaps the source metal of the source metal layer, in a location farther than the second part from the first electrode, and in which the part that overlaps the source metal of the source metal layer is away from the second part by 20 μm or more.

<Item 11>

The display panel described in any of the items 1 to 10 in which a gap between the second part and the first electrode is not more than 15 μm.

<Item 12>

The display panel described in any of the items 1 to 11 in which the display panel is a liquid-crystal display panel or an organic EL display panel.

Advantageous Effects of Disclosure

According to an embodiment of the disclosure, a display panel in which occurrence of defects due to ESD is suppressed is provided.

BRIEF DESCRIPTION OF DRAWINGS

FIG. 9 is a schematic diagram of a liquid-crystal display panel 100F according to a different embodiment of the disclosure.

DESCRIPTION OF EMBODIMENTS

Hereinafter, a display panel according to an embodiment of the disclosure will be described with reference to the drawings. A liquid-crystal display panel is presented below as an example; however, the display panel according to an embodiment of the disclosure is not limited to the liquid-crystal display panel presented below as an example and may be an organic EL display panel. As well known, a backplane (a circuit for driving organic EL devices as pixels arranged in a matrix shape) of an organic EL display panel has the same structure as that of a TFT substrate (active matrix substrate) of a liquid-crystal display panel.

Figure 1:
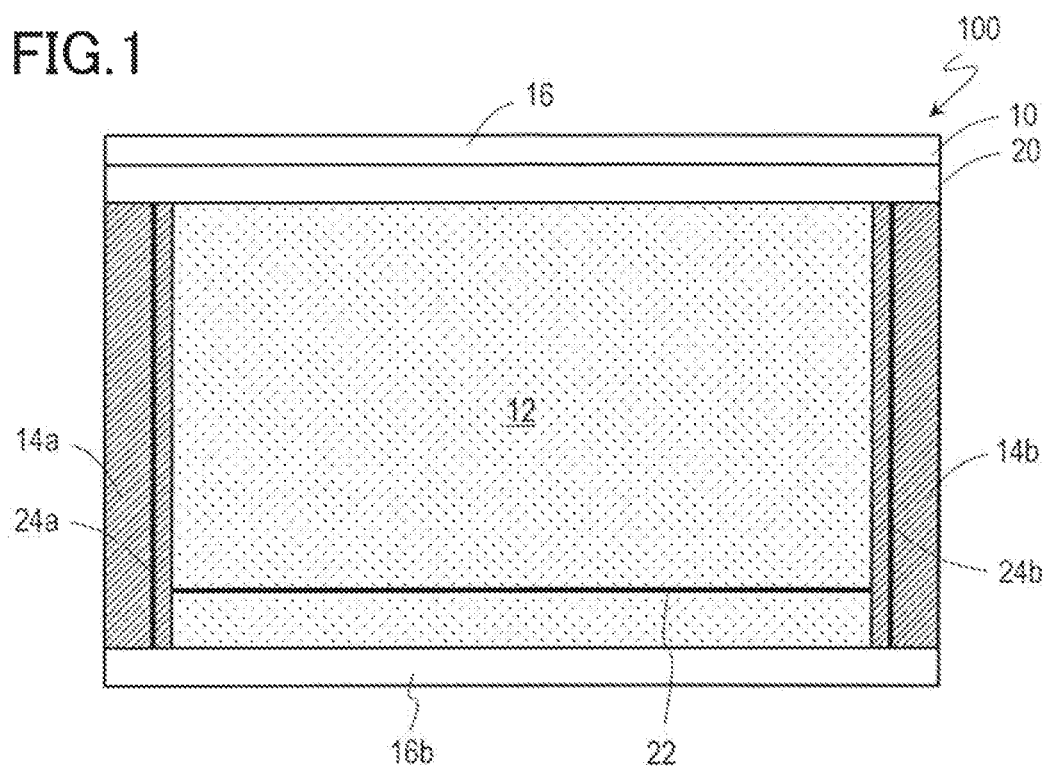
FIG. 1 is a schematic diagram of a liquid-crystal display panel 100 to which the disclosure is applied.

FIG. 1 is a schematic diagram of a liquid-crystal display panel 100 to which the disclosure is applied. The liquid-crystal display panel 100 includes a TFT substrate 10 and a counter substrate 20. Each of the TFT substrate 10 and the counter substrate 20 is typically a glass substrate on which a desired constituent element is formed. A liquid-crystal layer is provided between the TFT substrate 10 and the counter substrate 20. Some organic EL display panels do not include a counter substrate. The liquid-crystal display panel 100 has an active region 12 and a peripheral region disposed outside the active region 12. The peripheral region includes, for example, driving circuit regions 14a and 14b and a terminal region 16. In the driving circuit regions 14a and 14b, a gate driver (not illustrated) that supplies a scan signal to a gate bus line 22 is formed. The terminal region 16 is exposed from the counter substrate 20, and a flexible substrate on which a source driver (not illustrated) and the like are mounted is connected to the terminal region 16.

An increase in the size of the liquid-crystal display panel 100 increases the length of the gate bus line 22, increases an area occupied by a gate metal (a part in which a conductor is actually present) of a gate metal layer, and increases the amount of electric charges accumulated in the gate metal. In the driving circuit regions 14a and 14b, CLR trunk lines 24a and 24b that are formed of the gate metal layer and that are for supplying clear signals (reset signals) are disposed, and an area occupied by the CLR trunk lines 24a and 24b is also large. According to defect analysis by the present inventor, the electric charges accumulated in the gate bus line 22 jump (ESD) toward the CLR trunk lines 24a and 24b, a portion of the gate metal in the driving circuit regions is melted down, and an insulating film is destroyed. This ESD occurs between patterns of the gate metal layer close to each other when a gate insulating film and a semiconductor film are formed and subjected to patterning after the gate metal layer is formed (that is, after the gate metal film is deposited and subjected to patterning). When a source metal is formed on a melted-down portion of the gate metal in a following process, a short circuit (between the source metal and the gate metal; hereinafter referred to as "S-D short circuit" for simplicity) occurs on the melted-down portion. A liquid-crystal display panel of an embodiment of the disclosure can suppress this S-D short circuit.

Figure 2:
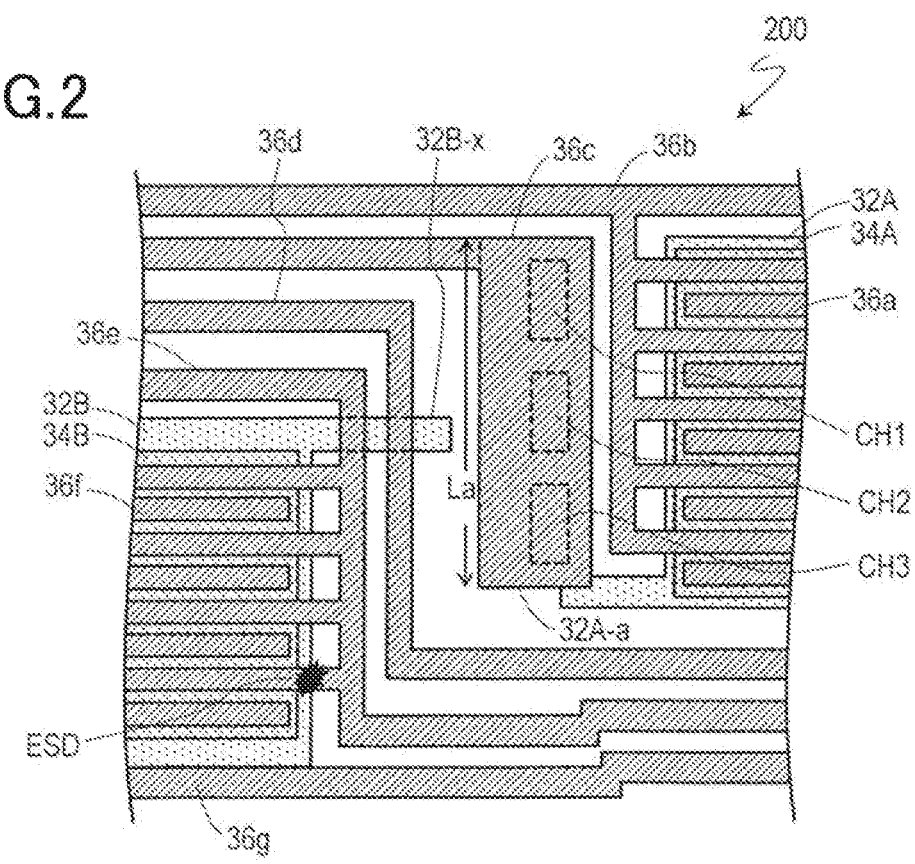
FIG. 2 is a schematic diagram for describing an ESD defect in a liquid-crystal display panel 200 of a comparative example.

Before describing the liquid-crystal display panel according to an embodiment of the disclosure, difficulty in suppressing occurrence of the aforementioned S-D short circuit will be described with reference to FIG. 2.

There is a schematic diagram for describing an ESD defect in a liquid-crystal display panel 200 of a comparative example. The illustrated region is present, for example, between the CLR trunk line 24a in the driving circuit region 14a and the active region 12 of the liquid-crystal display panel 100 illustrated in FIG. 1. That is, the right side in FIG. 2 is the active region 12, and a CLR trunk line is present on the left side. In FIG. 2, a first electrode 32A and a second electrode 32B that are included in a gate metal layer are illustrated. The first electrode 32A is, among electrodes provided in correspondence with respective gate bus lines in the active region 12, an electrode formed on the outermost side, and the second electrode 32B is an electrode closest to the first electrode 32A. That is, the first electrode 32A and the second electrode 32B are electrodes separated from each other in the left-right direction (first direction) and close to each other. A pair of electrodes in such a relationship can be present in each gate bus line. A driving circuit may be provided in the terminal region 16 in FIG. 1. Also in this case, the same structure can be present.

An insulating layer (gate insulating layer) (not illustrated) and a semiconductor layer (34A, 34B) are formed on a gate metal layer (32A, 32B), and a source metal layer (electrodes or wires 36a, 36b, 36c, 36d, 36e, 36f, and 36g) are formed thereon. An interdigitated electrode formed by the electrodes 36a and 36b is a source electrode and a drain electrode of a TFT using the first electrode 32A as a gate electrode. An interdigitated electrode formed by the electrodes 36e and 36f is a source electrode and a drain electrode of a TFT using the second electrode 32B as a gate electrode. These are the same in the following drawings.

The first electrode 32A includes a rectangular contact portion 32A-a that overlaps the electrode 36C of the source metal layer and that is connected to contact holes CH1, CH2, and CH3. The contact portion 32A-a has a first side having a length La on a side facing the second electrode 32B. Electric charges jump from somewhere in the contact portion 32A-a.

In the liquid-crystal display panel 200 of the comparative example, the second electrode 32B includes an ESD sacrificial portion 32B-x. The "ESD sacrificial portion" in the present specification is an additional part (also referred to as "extended part") that is unnecessary for the electrode to exert the function thereof and that is provided in a location where an ESD defect occurs more easily than in a part (also referred to as "electrode body") necessary for the electrode to exert the function thereof. The form of the ESD sacrificial portion is not particularly limited and may be a linear shape, an island shape, or a shape of a combination thereof.

The ESD sacrificial portion 32B-x is closest to the first electrode 32A, and thus, electric charges from the first electrode 32A has a highest probability of jumping to the ESD sacrificial portion 32B-x of the second electrode 32B. However, according to the study by the present inventor, as illustrated in FIG. 2 a portion ESD where an ESD defect has occurred, the ESD sacrificial portion 32B-x may not be able to exert a role as the ESD sacrificial portion, and jumping to another part (ESD in FIG. 2) of the second electrode 32B may occur. The longer the length La of the first side of the first electrode 32A, the more this becomes remarkable. Electric charges may jump by a distance of 100 μm or more, and the larger the distance, the lower the probability; however, it is not necessarily easy to predict where electric charges jump to.

Thus, the ESD sacrificial portion included in the liquid-crystal display panel according to an embodiment of the disclosure has a feature of including, in addition to a first part corresponding to the ESD sacrificial portion 32B-x and extending in the lateral direction (first direction), a second part that faces the first side and that extends in a second direction intersecting the first direction, the second part not overlapping the source metal of the source metal layer, and has a high probability of exerting the role as the ESD sacrificial portion, even when the length La of the first side is long (for example, 9 0 μm or more). For example, the width of each wire is about 7 μm, La is 90 μm, and the length of the active region in the lateral direction is about 700 mm in 32-type.

Figure 3:
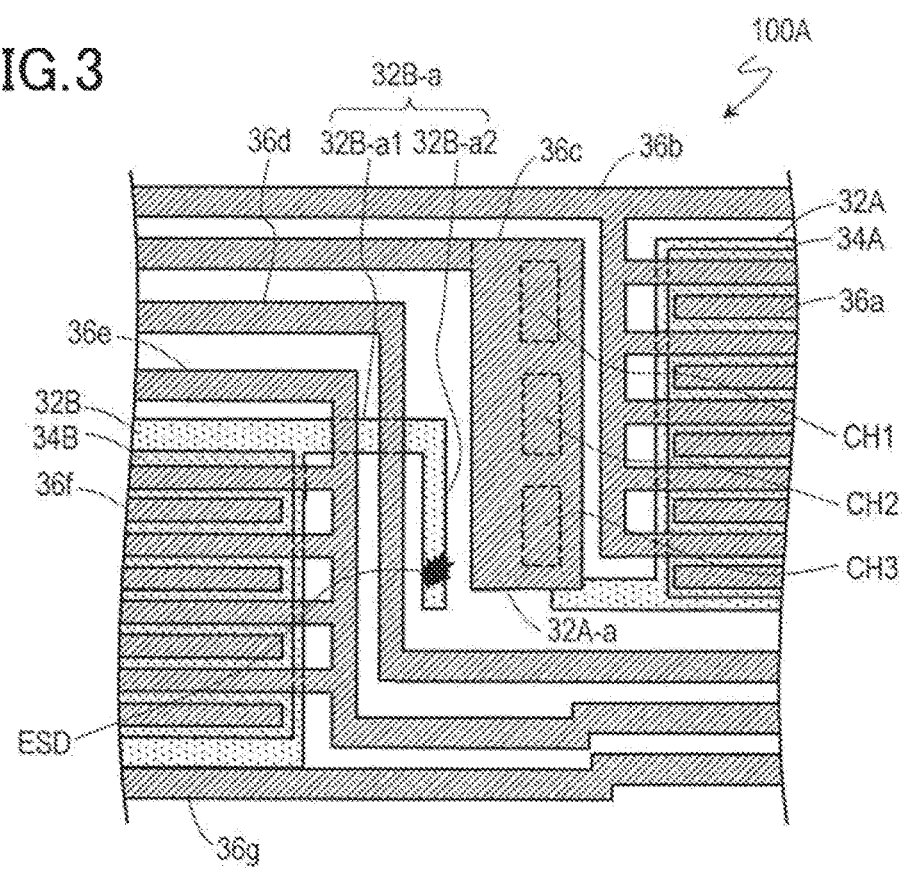
FIG. 3 is a schematic diagram of a liquid-crystal display panel 100A according to an embodiment of the disclosure.

A schematic diagram of a liquid-crystal display panel 100A according to an embodiment of the disclosure is illustrated in FIG. 3. The second electrode 32B of the liquid-crystal display panel 100A includes an ESD sacrificial portion 32B-a projecting toward the first side of the first electrode 32A. The ESD sacrificial portion 32B-a includes a first part 32B-a1 extending in the first direction and a second part 32B-a2 facing the first side and extending in the second direction intersecting the first direction, and the second part 32B-a2 does not overlap the source metal of the source metal layer. Here, the first part 32B-a1 of the ESD sacrificial portion 32B-a includes a part that overlaps the source metal of the source metal layer, and the second part 32B-a2 forms, with the first part 32B-a1, a bent portion. The ESD sacrificial portion 32B-a has an L-shape.

A gap between the second part 32B-a2 and the first electrode 32A (contact portion 32A-a) is preferably, for example, 15 μm or less. When it is more than 15 μm, the probability of exerting the role as the ESD sacrificial portion may not be sufficiently obtained. The lower limit of the gap between the second part 32B-a2 and the first electrode 32A can be determined in consideration of patterning accuracy (including alignment accuracy) and is, for example, 5 μm or more. This is common to liquid-crystal display panels according to other embodiments described below, and a gap between the second part closest to the first electrode 32A and the first electrode 32A is preferably, for example, not more than 15 μm, and the lower limit is preferably, for example, 5 μm or more.

Figure 4:
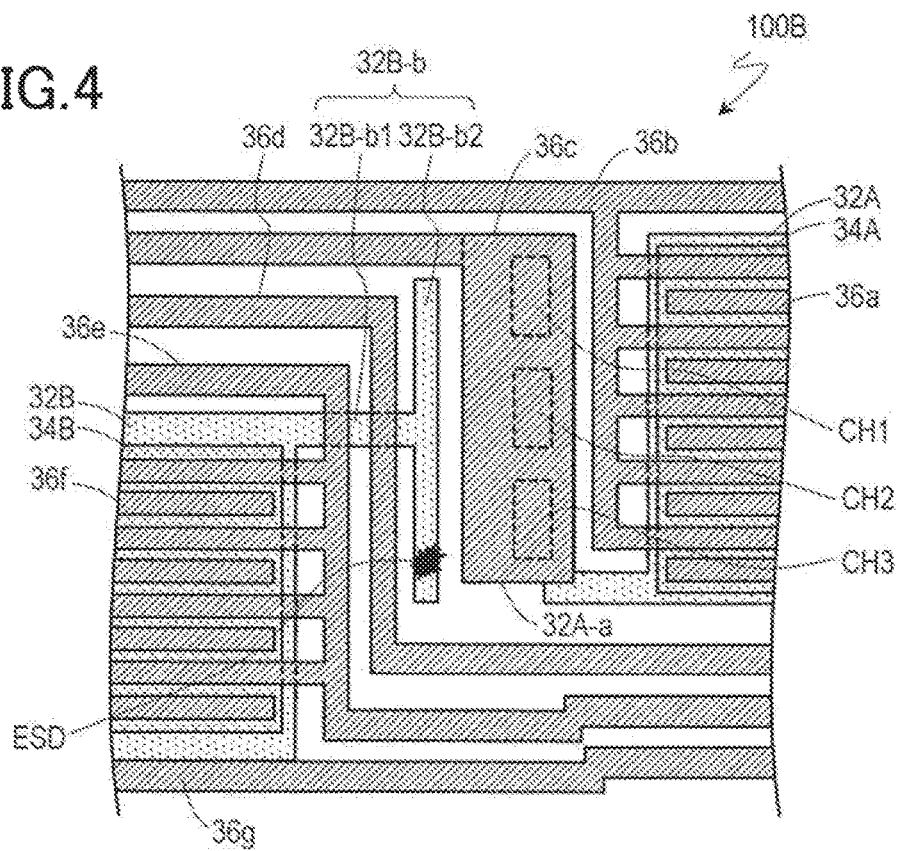
FIG. 4 is a schematic diagram of a liquid-crystal display panel 100B according to a different embodiment of the disclosure.

A schematic diagram of a liquid-crystal display panel 100B according to an embodiment of the disclosure is illustrated in FIG. 4. The second electrode 32B of the liquid-crystal display panel 100B includes an ESD sacrificial portion 32B-b. The ESD sacrificial portion 32B-b includes a first part 32B-b1 extending in the first direction and a second part 32B-b2 facing the first side and extending in the second direction intersecting the first direction, and the second part 32B-b2 does not overlap the source metal of the source metal layer. Here, the first part 32B-b1 of the ESD sacrificial portion 32B-b includes a part that overlaps the source metal of the source metal layer, and the second part 32B-b2 forms, with the first part 32B-b1, a T-shaped portion. A length in which the second part 32B-b2 faces the first side is larger than the length of the second part 32B-a2 of the ESD sacrificial portion 32B-a, and there is thus a high probability of exerting the role as an ESD sacrificial layer. A gap between the second part 32B-b2 and the first electrode 32A (contact portion 32A-a) is preferably, for example, not more than 15 μm.

Figure 5:
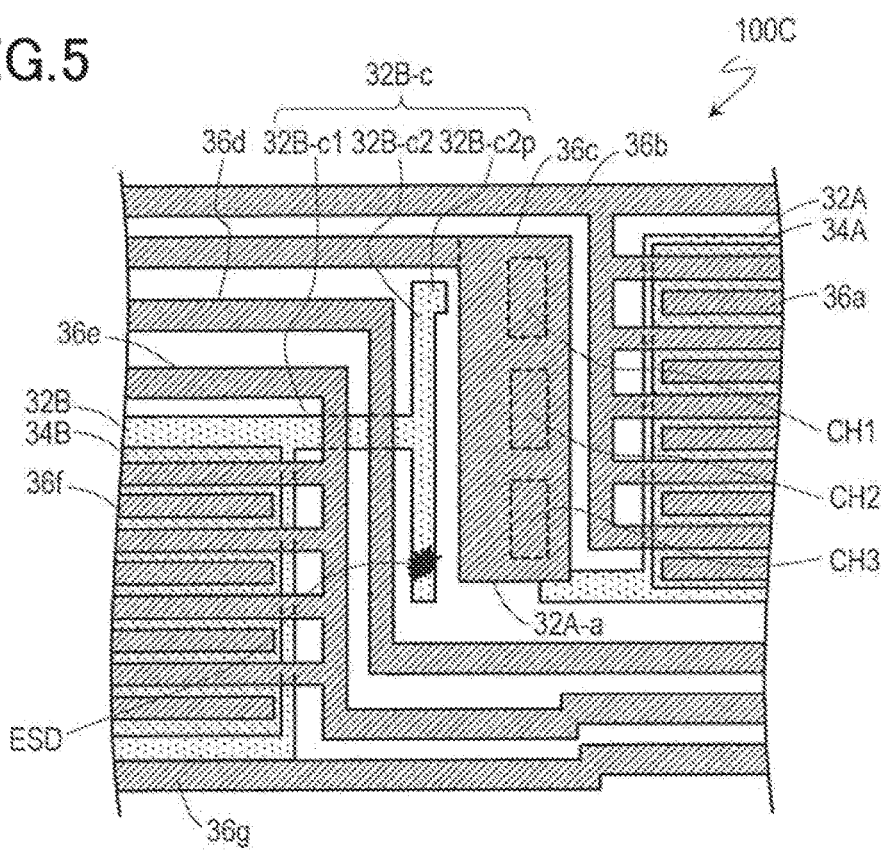
FIG. 5 is a schematic diagram of a liquid-crystal display panel 100C according to a different embodiment of the disclosure.

A schematic diagram of a liquid-crystal display panel 100C according to an embodiment of the disclosure is illustrated in FIG. 5. The second electrode 32B of the liquid-crystal display panel 100C includes an ESD sacrificial portion 32B-c. The ESD sacrificial portion 32B-c includes, as with the ESD sacrificial portion 32B-b, a first part 32B-c1 extending in the first direction and a second part 32B-c2 facing the first side and extending in the second direction intersecting the first direction, and the second part 32B-c2 does not overlap the source metal of the source metal layer. Here, the first part 32B-c1 of the ESD sacrificial portion 32B-c includes a part that overlaps the source metal of the source metal layer, and the second part 32B-c2 forms, with the first part 32B-c1, a T-shaped portion.

The second part 32B-c2 further includes a part 32B-c2p projecting toward the first side. The projecting part 32B-c2p is closest to the first electrode 32A and thus can make the probability of occurrence of ESD therebetween highest. Therefore, the probability of occurrence of ESD in other locations in the second electrode 32B can be reduced. The projecting part 32B-c2p is preferably formed in a location farthest from a part at which the second electrode 32B overlaps the source metal (the electrodes 36e and 36f). Therefore, in FIG. 5, the projecting part 32B-c2p is formed on the uppermost side of the second part 32B-c2. The length (in the second direction) of the projecting part 32B-c2p is preferably, for example, 2 μm or more and 10 μm or less, and a gap between the projecting part 32B-c2p and the first electrode 32A (contact portion 32A-a) is preferably, for example, not more than 15 µm.

Figure 6:
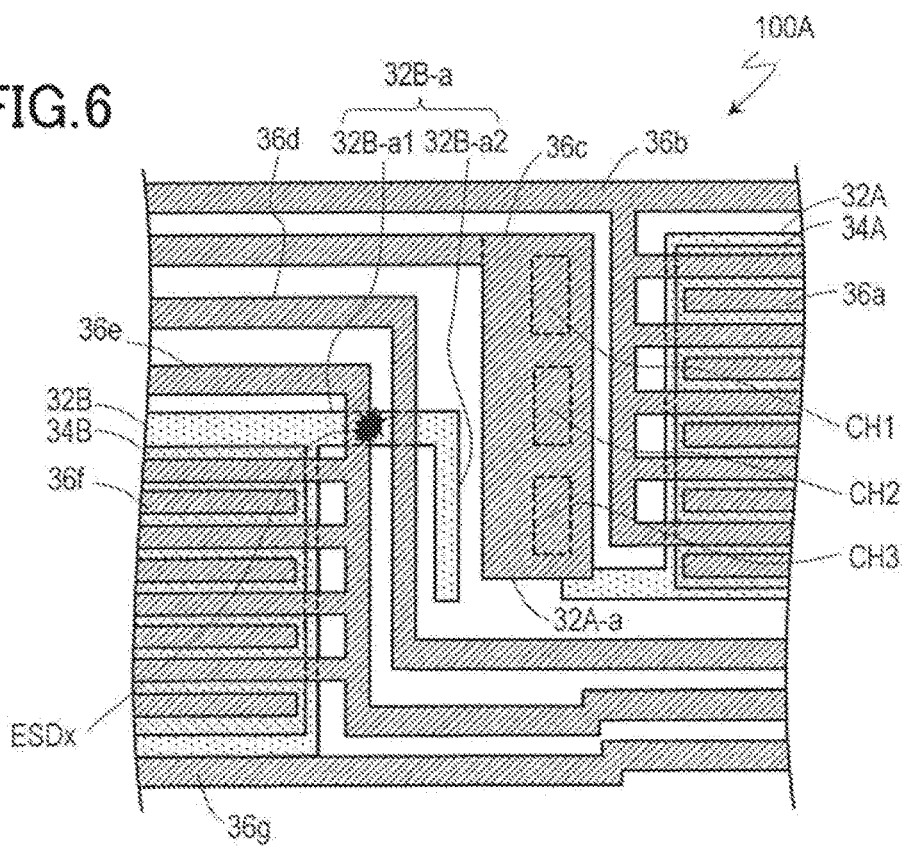
FIG. 6 is a schematic diagram for describing an ESD defect that can occur in the liquid-crystal display panel 100B according to an embodiment of the disclosure.

An ESD defect may occur as illustrated in FIG. 6, although the probability thereof is low, in the liquid-crystal display panel 100A provided with the ESD sacrificial portion 32B-a illustrated in FIG. 3. A portion ESDx where an ESD defect has occurred is a part overlapping the source metal (the electrode 36e) in the first part 32B-a1 extending in the first direction in the ESD sacrificial portion 32B-a. That is, to avoid this ESD defect, a part at which the ESD sacrificial portion 32B-a overlaps the source metal can be spaced away from the first electrode 32A (the contact portion 32A-a). The part at which the ESD sacrificial portion 32B-a overlaps the source metal is preferably away from the second part 32B-a2 by about 20 µm or more. Although it is rare, ESD may further jump within a range (in the left direction in the figure, here) of about 20 µm from a portion subjected to ESD. It is possible to prevent occurrence of a defect when such secondary ESD occurs, by separating the part at which the ESD sacrificial portion 32B-a overlaps the source metal from the second part 32B-a2 by about 20 µm or more.

Figure 7:
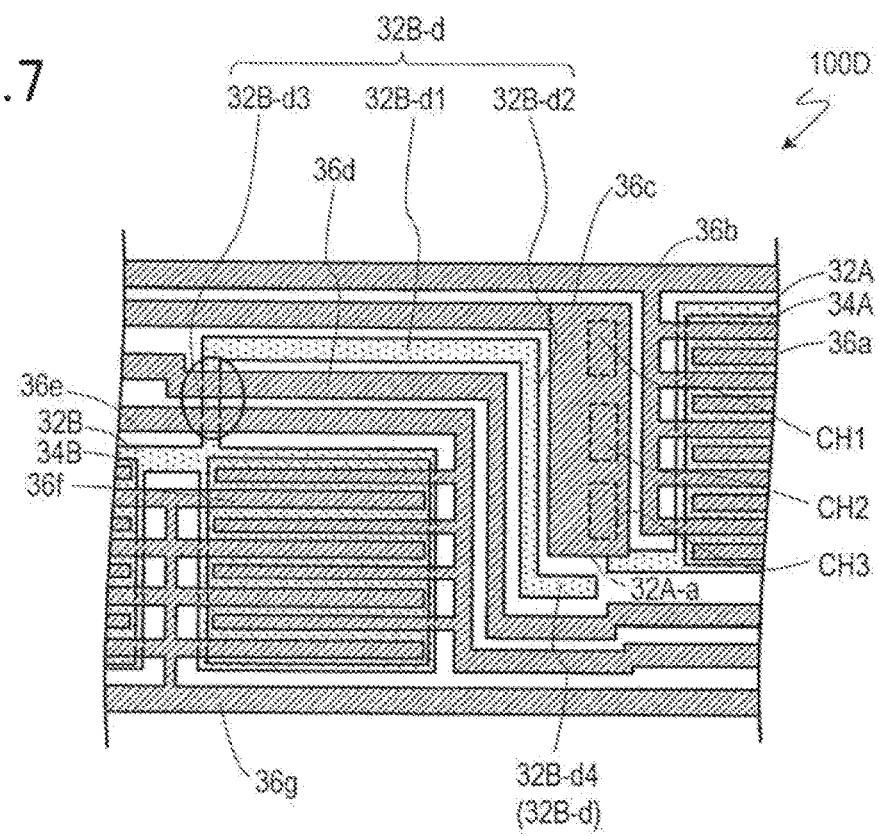
FIG. 7 is a schematic diagram of a liquid-crystal display panel 100D according to a different embodiment of the disclosure.

A schematic diagram of a liquid-crystal display panel 100D according to an embodiment of the disclosure is illustrated in FIG. 7. The second electrode 32B of the liquid-crystal display panel 100D includes an ESD sacrificial portion 32B-d. The ESD sacrificial portion 32B-d includes a first part 32B-d1 extending in the first direction and a second part 32B-d2 facing the first side and extending in the second direction intersecting the first direction and further includes a third part 32B-d3 extending in a direction intersecting the first direction, and the first part 32B-d1 is formed between the second part 32B-d2 and the third part 32B-d3. The third part 32B-d3 includes a part that overlaps the source metal (36d, 36e), and the first part 32B-d1 and the second part 32B-d2 do not overlap the source metal of the source metal layer. That is, the part at which the ESD sacrificial portion 32B-d overlaps the source metal is spaced away from the first electrode 32A (the contact portion 32A-a) as a result of the first part 32B-d1 being disposed in a location that does not overlap the source metal, the length of the first part 32B-d1 increasing, and the third part 32B-d3 being formed to overlap the source metal (36d, 36e).

In the ESD sacrificial portion 32B-d, the part that overlaps the source metal of the source metal layer is disposed in a location farther than a side of the electrode body of the second electrode 32B excluding the ESD sacrificial portion 32B-d, the side being near the first electrode 32A-a, from the first electrode 32A-a. Employing such a configuration enables the part at which the ESD sacrificial portion 32B-d overlaps the source metal to be easily separated from the second part 32B-d2 by, for example, 100 µm or more.

Moreover, the ESD sacrificial portion 32B-d includes a fourth part 32B-d4 extending from the second part 32B-d2, and the fourth part 32B-d4 faces a second side intersecting the first side of the first electrode 32A (contact portion 32A-a). Therefore, the ESD sacrificial portion 32B-d faces a larger number of sides near the second electrode 32B of the first electrode 32A (contact portion 32A-a), and thus, the possibility of exerting the role as the ESD sacrificial portion is further increased. A gap between the fourth part 32B-d4 and the second side of the first electrode 32A (contact portion 32A-a) is also preferably, for example, not more than 15 µm, and the lower limit is preferably, for example, 5 µm or more. The fourth part 32B-d4 may be omitted. Of course, the ESD sacrificial portion of the above-described liquid-crystal display panel 100A, 100B, or 100C may be provided with a part corresponding to the fourth part 32B-d4.

Figure 8:
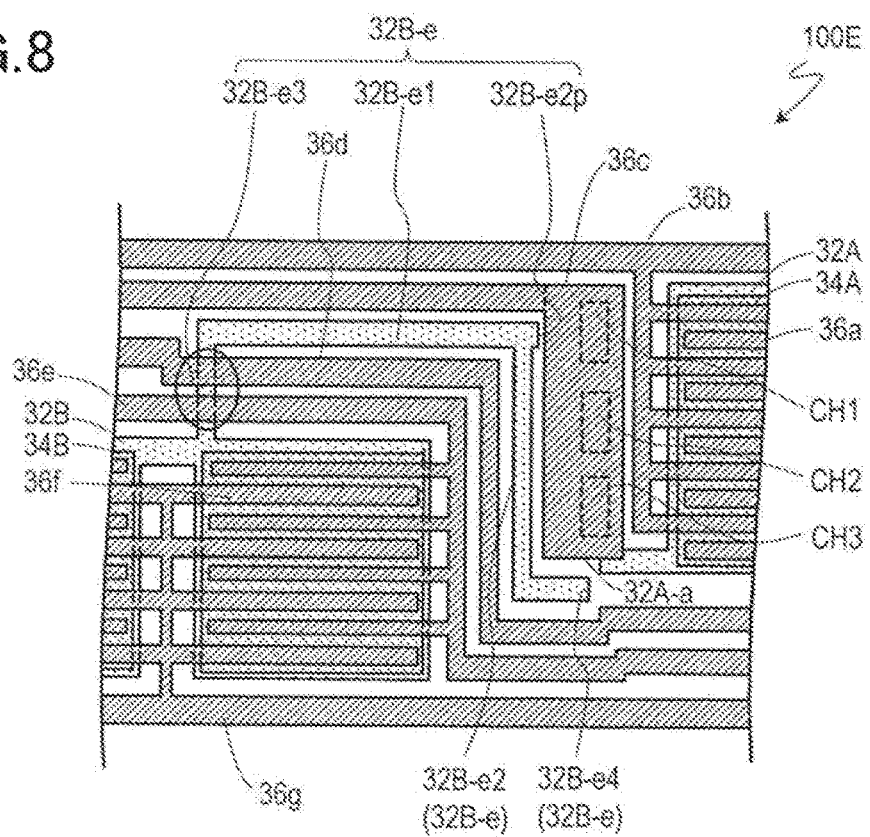
FIG. 8 is a schematic diagram of a liquid-crystal display panel 100E according to a different embodiment of the disclosure.

A schematic diagram of a liquid-crystal display panel 100E according to an embodiment of the disclosure is illustrated in FIG. 8. The second electrode 32B of the liquid-crystal display panel 100E includes an ESD sacrificial portion 32B-e. The ESD sacrificial portion 32B-e includes, as with the ESD sacrificial portion 32B-d, a first part 32B-e1 extending in the first direction and a second part 32B-e2 facing the first side and extending in the second direction intersecting the first direction and further includes a third part 32B-e3 extending in a direction intersecting the first direction, and the first part 32B-e1 is formed between the second part 32B-e2 and the third part 32B-e3. The third part 32B-e3 includes a part that overlaps the source metal (36d, 36e), and the first part 32B-e1 and the second part 32B-e2 do not overlap the source metal of the source metal layer.

Also in the ESD sacrificial portion 32B-e, as with the ESD sacrificial portion 32B-d, the part that overlaps the source metal of the source metal layer is disposed in a location farther than a side of the electrode body of the second electrode 32B excluding the ESD sacrificial portion 32B-e, the side being near the first electrode 32A-a, from the first electrode 32A-a. Employing such a configuration enables the part at which the ESD sacrificial portion 32B-e overlaps the source metal to be easily separated from the second part 32B-e2 by, for example, 100 µm or more.

The ESD sacrificial portion 32B-e further includes a fourth part 32B-e4 extending from the second part 32B-e2, and the fourth part 32B-e4 faces the second side intersecting the first side of the first electrode 32A (contact portion 32A-a).

The second part 32B-e2 further includes a part 32B-e2p projecting toward the first side. The projecting part 32B-e2p is closest to the first electrode 32A and thus can make the probability of occurrence of ESD therebetween highest. Therefore, the probability of occurrence of ESD in other locations in the second electrode 32B can be reduced. The projecting part 32B-e2p is preferably formed in a location sufficiently away from the part at which the second electrode 32B overlaps the source metal (the electrodes 36e and 36f). Therefore, the projecting part 32B-e2p is formed on the uppermost side of the second part 32B-e2 in FIG. 8. The length (in the second direction) of the projecting part 32B-e2p is preferably, for example, 2 µm or more and 10 µm or less, and a gap between the projecting part 32B-e2p and the first electrode 32A (contact portion 32A-a) is preferably, for example, 5 µm or more and 15 µm or less.

A schematic diagram of a liquid-crystal display panel 100F according to an embodiment of the disclosure is illustrated in FIG. 9. The second electrode 32B of the liquid-crystal display panel 100F includes an ESD sacrificial portion 32B-f. The ESD sacrificial portion 32B-f includes a first part 32B-f1 extending in the first direction and a second part 32B-f2 facing the first side and extending in the second direction intersecting the first direction and further includes a third part 32B-f3 extended in a direction intersecting the first direction, and the first part 32B-f1 is formed between the second part 32B-f2 and the third part 32B-f3. The first part 32B-f1 includes a part that overlaps the source metal (36d, 36e) of the source metal layer, and the second part 32B-f2 and the third part 32B-f3 do not overlap the source metal of the source metal layer.

In contrast to the third part 32B-d3 illustrated in FIG. 7 and the third part 32B-e3 illustrated in FIG. 8 each having a linear shape and having a part overlapping the source metal (36d, 36e), the third part 32B-f3 of the ESD sacrificial portion 32B-f illustrated in FIG. 9 has an island shape and does not overlap the source metal (36d, 36e). The ESD sacrificial portion 32B-f includes a part at which the first part 32B-f1 overlaps the source metal (36d, 36e) of the source metal layer.

Also in the ESD sacrificial portion 32B-f, as with the ESD sacrificial portion 32B-d (FIG. 7) and the ESD sacrificial portion 32B-e (FIG. 8), the part that overlaps the source metal of the source metal layer is disposed in a location farther than a side of the electrode body of the second electrode 32B excluding the ESD sacrificial portion 32B-f, the side being near the first electrode 32A-a, from the first electrode 32A-a. Employing such a configuration enables the part at which the ESD sacrificial portion 32B-f overlaps the source metal to be easily separated from the second part 32B-f2 by, for example, 100 μm or more.

The display panel according to an embodiment of the disclosure is not limited to the aforementioned examples. The shape of the first electrode and/or the second electrode can be variously modified, and the ESD portions also may be variously modified. The embodiments of the disclosure can be applied to, not limited to the aforementioned examples, various active matrix type display panels.

The display panel according to an embodiment of the disclosure is widely applied to liquid-crystal display panels and active matrix type display panels, such as an organic EL display panel.

The invention claimed is:

1. A display panel having an active region and a peripheral region including a driving circuit region disposed outside the active region in a first direction,
the display panel comprising a substrate, a gate metal layer formed on the substrate, an insulating layer that covers the gate metal layer, and a source metal layer formed on the insulating layer,
wherein, in the driving circuit region, the gate metal layer includes a first electrode and a second electrode separated from each other in the first direction and close to each other,
wherein the first electrode is positioned nearer than the second electrode to the active region and has a first side on a side facing the second electrode,
wherein the second electrode includes an ESD sacrificial portion, and
wherein the ESD sacrificial portion includes a first part extending in the first direction and a second part facing the first side and extending in a second direction intersecting the first direction, the second part not overlapping a source metal of the source metal layer.

2. The display panel according to claim 1, wherein the first part of the ESD sacrificial portion includes a part that overlaps the source metal of the source metal layer, and the second part forms, with the first part, a bent portion.

3. The display panel according to claim 1, wherein the first part of the ESD sacrificial portion includes a part that overlaps the source metal of the source metal layer, and the second part forms, with the first part, a T-shaped portion.

4. The display panel according to claim 1,
wherein the ESD sacrificial portion further includes a third part extended in a direction intersecting the first direction,
wherein the first part is formed between the second part and the third part,
wherein the first part includes a part that overlaps the source metal of the source metal layer, and
wherein the second part and the third part do not overlap the source metal of the source metal layer.

5. The display panel according to claim 1, wherein the first part of the ESD sacrificial portion includes a part that overlaps the source metal of the source metal layer, in a location farther than a center of the first part in the first direction from the first electrode.

6. The display panel according to claim 1,
wherein the ESD sacrificial portion further includes a third part extending in a direction intersecting the first direction,
wherein the first part is formed between the second part and the third part,
wherein the third part includes a part that overlaps the source metal of the source metal layer, and
wherein the first part and the second part do not overlap the source metal of the source metal layer.

7. The display panel according to claim 1, wherein the second part includes a part projecting toward the first side.

8. The display panel according to claim 1, wherein the ESD sacrificial portion includes a fourth part extending from the second part, the fourth part facing a second side of the first electrode, the second side intersecting the first side.

9. The display panel according to claim 1, wherein the ESD sacrificial portion includes a part that overlaps the source metal of the source metal layer, in a location farther than a side of an electrode body of the second electrode excluding the ESD sacrificial portion, the side being near the first electrode, from the first electrode.

10. The display panel according to claim 1,
wherein the ESD sacrificial portion includes a part that overlaps the source metal of the source metal layer, in a location farther than the second part from the first electrode, and
wherein the part that overlaps the source metal of the source metal layer is away from the second part by 20 μm or more.

11. The display panel according to claim 1, wherein a gap between the second part and the first electrode is not more than 15 μm.

12. The display panel according to claim 1, wherein the display panel is a liquid-crystal display panel or an organic EL display panel.

* * * * *